(12) United States Patent
Zheng et al.

(10) Patent No.: US 12,726,228 B2
(45) Date of Patent: Sep. 1, 2026

(54) SIGNAL RECEIVING APPARATUS AND METHOD, AND STORAGE MEDIUM

(71) Applicant: SMARTER MICROELECTRONICS (GUANG ZHOU) CO., LTD., Guangzhou (CN)

(72) Inventors: Yaohua Zheng, Guangzhou (CN); Minjun He, Guangzhou (CN); Shunqi Yao, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 416 days.

(21) Appl. No.: 18/468,708

(22) Filed: Sep. 16, 2023

(65) Prior Publication Data

US 2024/0007141 A1 Jan. 4, 2024

Related U.S. Application Data

(63) Continuation of application No. PCT/CN2022/109445, filed on Aug. 1, 2022.

(30) Foreign Application Priority Data

Jul. 30, 2021 (CN) ......................... 202110869240.5

(51) Int. Cl.

*H04B 7/00* (2006.01)
*H03F 1/26* (2006.01)
*H04B 1/403* (2015.01)

(52) U.S. Cl.

CPC ............... *H04B 1/403* (2013.01); *H03F 1/26* (2013.01); *H03F 2200/294* (2013.01); *H03F 2200/451* (2013.01)

(58) Field of Classification Search

CPC ... H01L 25/105; H01L 25/115; H01L 25/162; H01L 2224/01; H01L 2224/05298; H04B 1/403; H04B 2001/0408; H04B 1/16; H04B 1/18

See application file for complete search history.

(56) References Cited

U.S. PATENT DOCUMENTS 9,774,076 B2 * 9/2017 Leiba .................. H01Q 9/0407
11,637,051 B2 * 4/2023 Lin ....................... H01L 23/552 361/679.54
11,670,599 B2 * 6/2023 Han ..................... H01L 23/647 257/659

* cited by examiner

*Primary Examiner* — Tuan Pham
(74) *Attorney, Agent, or Firm* — Syncoda LLC; Feng Ma

(57) ABSTRACT

A signal receiving apparatus includes a filter, an amplifier, a lamina and a bare die disposed on the lamina. The filter is configured to filter a received signal. The filter includes at least one capacitor and at least one inductor. The at least one capacitor is disposed on the bare die. The at least one inductor is disposed on the lamina. The at least one inductor is connected to the bare die. The amplifier is configured to amplify a signal filtered through the filter. The signal receiving apparatus provided by the disclosure can solve a problem of poor overall performance of a receiving link in some implementations and improve the overall performance of the signal receiving apparatus.

10 Claims, 6 Drawing Sheets

SIGNAL RECEIVING APPARATUS AND METHOD, AND STORAGE MEDIUM

CROSS-REFERENCE TO RELATED APPLICATIONS

This is a continuation of International Application No. PCT/CN2022/109445 filed on Aug. 1, 2022, which claims priority to Chinese Patent Application No. 202110869240.5 filed on Jul. 30, 2021. The disclosures of the above-referenced applications are hereby incorporated by reference in their entirety.

BACKGROUND

With the development of the technology of wireless communication, a mobile terminal needs to support more and more working frequency bands, and the amount of data wirelessly transmitted is increasing. As a result, the performance requirements of a receiving link in the mobile terminal are getting higher and higher.

SUMMARY

The disclosure relates to the technical field of wireless communication, and in particular to a signal receiving apparatus, a signal receiving method and a storage medium.

In some implementations, an inductor in a filter module is disposed on a bare die, in the receiving link of the mobile terminal. This usually causes the overall performance of the receiving link to be poor.

Embodiments of the present disclosure provide a signal receiving apparatus having an improved overall performance, in order to solve at least one problem existing in some implementations.

The technical solution of the disclosure is implemented as follows.

In the first aspect, the embodiments of the disclosure provide a signal receiving apparatus. The apparatus includes a filter, a lamina, and a bare die disposed on the lamina. At least one radio frequency (RF) device is disposed on the bare die. The at least one radio frequency device and the filter are connected on the bare die. The filter is configured to filter a received signal. The filter includes at least one capacitor and at least one inductor.

The at least one capacitor is disposed on the bare die.

The at least one inductor is disposed on the lamina. The at least one inductor is connected to the bare die.

In the second aspect, the embodiments of the disclosure provide a signal receiving method applied to a signal receiving apparatus. The signal receiving apparatus includes a filter. The method includes the following operation.

A received signal is filtered through the filter to obtain a filtered signal. The filter includes at least one capacitor and at least one inductor. The at least one capacitor is disposed on the bare die. The at least one inductor is disposed on the lamina. The at least one inductor is connected to the bare die. At least one radio frequency device is disposed on the bare die. The at least one radio frequency device and the filter are connected on the bare die.

In the third aspect, the embodiments of the disclosure provide a storage medium storing a computer program. When the computer program is executed by a processor, the signal receiving method according to the above embodiments is performed.

The disclosure provides a signal receiving apparatus. The apparatus includes a filter, a lamina, a bare die disposed on the lamina. At least one radio frequency device is disposed on the bare die. The at least one radio frequency device and the filter are connected on the bare die. The filter is configured to filter a received signal. The filter includes at least one capacitor and at least one inductor. The at least one capacitor is disposed on the bare die. The at least one inductor is disposed on the lamina. The at least one inductor is connected to the bare die. In this way, since the at least one inductor is disposed on the lamina, a quality factor of the inductor in the filter can be improved, thereby improving an overall performance of the signal receiving apparatus.

DETAILED DESCRIPTION

Figure 1:
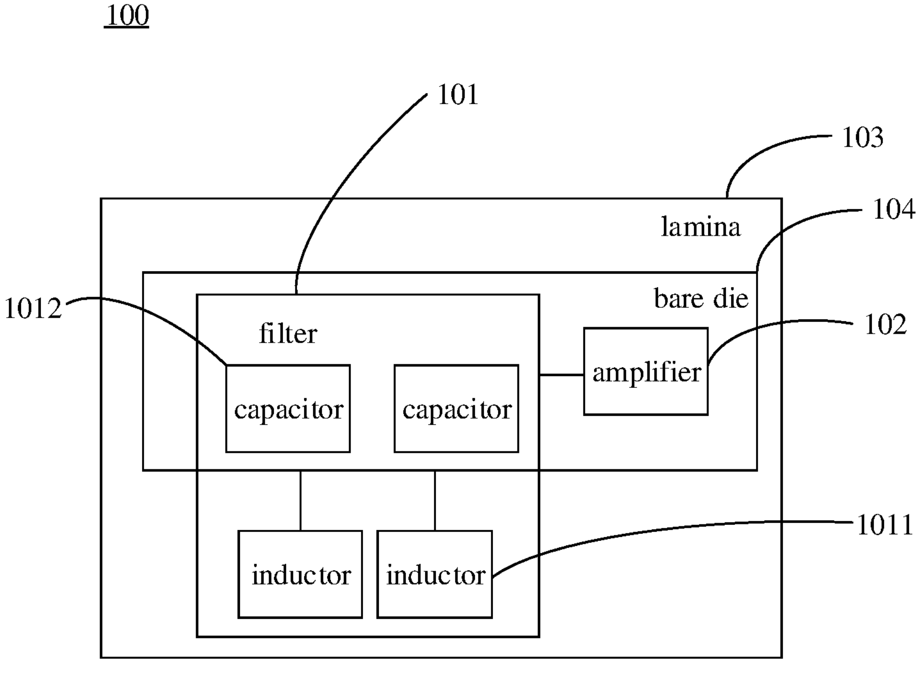
FIG. 1 shows an alternative structure diagram of a signal receiving apparatus provided by an embodiment of the disclosure.

In order to make the objectives, technical solutions and advantages of embodiments of the disclosure more clear, the specific technical solutions of the disclosure will be described in further detail below, with reference to accompanying drawings in the embodiments of the disclosure. The following embodiments are intended to illustrate the embodiments of the disclosure, but are not intended to limit the scope of the embodiments of the disclosure.

Unless otherwise defined, all technical and scientific terms used herein have the same meanings as those commonly understood by those skilled in the art to which the embodiments of the disclosure pertain. Herein, terms used in the specification of the disclosure are only intended to describe specific embodiments, and are not intended to limit the disclosure. The term "and/or" as used herein includes any and all combinations of one or more relevant items listed.

Before the disclosure is further explained in detail, the terminologies and terms referred to in the embodiments of the disclosure are explained. The terminologies and terms referred to in the embodiments of the disclosure are interpreted as follows.

1) Time Division Duplexing (TDD), a full duplex communication technology used in a mobile communication system. TDD uses time slots to separate receiving and transmitting channels. Receiving and transmitting use different time slots of a same frequency carrier wave as carriers of the channels.

2) Bare die, a chip that has not been packaged after a wafer has been cut and tested, in which the wafer refers to a silicon wafer formed by grinding, polishing and slicing a silicon material.

3) Lamina, a support for carrying other components, such as a printed circuit board (PCB).

4) Bonding wire, a part that transmits electrical signals.

The signal receiving apparatus provided by the embodiments of the disclosure can be applied to TDD technology.

With the development of wireless communication technology, diversified wireless frequency spectra are available. In this case, a mobile terminal needs to support more and more working frequency bands. In addition, with the increasing amount of data wirelessly transmitted, a receiving link in a RF front-end module of the mobile terminal needs to support not only multi-band work, but also multi-channel reception in a same frequency band. This requires higher and higher performance and integration of the receiving link in the RF front-end module.

For a mobile communication terminal of TDD, a receiving link in a RF front-end mainly includes a RF switch (SW) module, a RF filter module and a low noise amplifier (LNA) module. There are two main methods to implement the receiving link in a conventional RF front-end. One method is that modules are separated from each other and implemented separately. The RF switch and LNA are implemented based on silicon on insulator (SOI) of an insulating substrate with high performance. In order to obtain better performance, the filter is implemented based on low temperature co-fired ceramic (LTCC), surface acoustic wave (SAW), bulk acoustic wave (BAW) or LC filter designed based on integrated passive device (IPD). Interfaces between the modules are interconnected on LMT in the RF front-end module for secondary integration, so that the receiving link formed thereby has better performance. The other method is that modules are implemented by total integration based on a silicon process. The RF switch module, the filter module and the low noise amplifier module etc. are all implemented on a same bare die, and the modules are interconnected on the same bare die. The receiving link implemented by this method has high integration and low cost.

In view of problems that the methods for implementing the receiving link in the conventional RF front-end module may increase complexity of interconnection of inputs and outputs between modules of the receiving link, a large space of the RF front-end module may be occupied or the link may have poor performance, etc., the disclosure proposes a signal receiving apparatus, which can improve the overall performance of the receiving apparatus.

The disclosure will be further explained in detail through accompanying drawings and specific embodiments.

The embodiments of the disclosure provide a signal receiving apparatus. The apparatus includes a filter, a lamina, a bare die disposed on the lamina. At least one radio frequency device is disposed on the bare die. The at least one radio frequency device and the filter are connected on the bare die. The filter is configured to filter a received signal. The filter includes at least one capacitor and at least one inductor. The at least one capacitor is disposed on the bare die. The at least one inductor is disposed on the lamina. The at least one inductor is connected to the bare die.

In some embodiments, the at least one RF device may include modules in the RF front-end receiving link. Exemplarily, the RF device includes an amplifier, a RF switch, etc., which may be selected according to the actual situation. This is not limited in the embodiments of the disclosure.

In some embodiments of the disclosure, as shown in FIG. 1, a signal receiving apparatus 100 is provided. The apparatus 100 includes a filter 101, an amplifier 102, a lamina (LMT) 103, and a bare die 104 disposed on the lamina 103. The filter 101 includes an inductor 1011 and a capacitor 1012. At least one inductor is disposed on the lamina. At least one capacitor is disposed on the bare die. The inductor disposed on the lamina is connected to the bare die 104. The amplifier 102 is disposed on the bare die 104.

Here, the way by which the bare die 104 is disposed on the lamina 103 may include a silicon on insulator (SOI) process, so that the bare die 104 is mounted on the lamina 103.

At least one inductor is disposed on the lamina, in which some or all of the at least one inductor is disposed on the lamina. It is to be noted that, the inductors of the filter may be all disposed on the lamina or partially disposed on the lamina. The inductor may be disposed on the lamina in the form of a surface mounted device (SMD) or by winding wires, without limitation here.

The at least one inductor is connected to the bare die, in which each of the at least one inductor is connected to the bare die through wiring. The wiring connected to the bare die may be part of the inductor, which is beneficial to reduce the influence of the interconnecting wiring on the performance.

In an embodiment of the disclosure, as shown in FIG. 1, the filter 101 includes two capacitors and two inductors, as an example. In practical application, the filter may include other numbers of capacitors and other numbers of inductors, for example, 3 capacitors and 3 inductors, 1 capacitor and 2 inductors, 3 capacitors and 2 inductors, etc. This is not limited in the embodiments of the disclosure.

As shown in FIG. 1, the numbers of the capacitors and the inductors included in the filter are both two. The number of the capacitors is the same as the number of the inductors. In practical application, the numbers of the capacitors and the inductors included in the filter may be different. For example, the number of the inductors may be larger than the number of the capacitors, or the number of the inductors may be less than the number of the capacitors, which is not limited in the embodiments of the disclosure.

A frequency range of a signal received by the filter may include frequency f1 to frequency f2. The filter filters the received signal of frequency f1 to frequency f2 to obtain a signal of frequency f3 to frequency f4. The frequency f3 and frequency f4 are frequencies included in the range from frequency f1 to frequency f2.

In an example, the signal received by the filter includes a signal with a frequency ranging from 2.401 GHz to 2.422 GHz. The filter filters the received signal with the frequency ranging from 2.401 GHz to 2.422 GHz, to obtain a signal with a frequency ranging from 2.412 GHz to 2.414 GHz.

In an example, the signal received by the filter includes a signal with a frequency ranging from 1 GHz to 6 GHz. After the filter filters the received signal, a signal with a frequency ranging from 3.3 GHz to 4.2 GHz is obtained.

In the embodiments of the disclosure, the filter may include a passive filter, also known as an inductance-capacitance (LC) filter. The LC filter may include at least one capacitor and at least one inductor.

The amplifier may be a low noise amplifier (LNA). The LNA is an amplifier with a low noise figure, for example, the noise figure F=1. In other embodiments, the amplifier may also be a power amplifier (PA).

The embodiments of the disclosure further provide a signal receiving method, which is applied to the signal receiving apparatus provided by the embodiments of disclosure. The signal receiving apparatus includes a filter, a lamina, a bare die disposed on the lamina. At least one radio frequency device is disposed on the bare die. The at least one radio frequency device and the filter are connected on the bare die. The method includes the following operation.

A received signal is filtered through the filter, to obtain a filtered signal.

Figure 2:
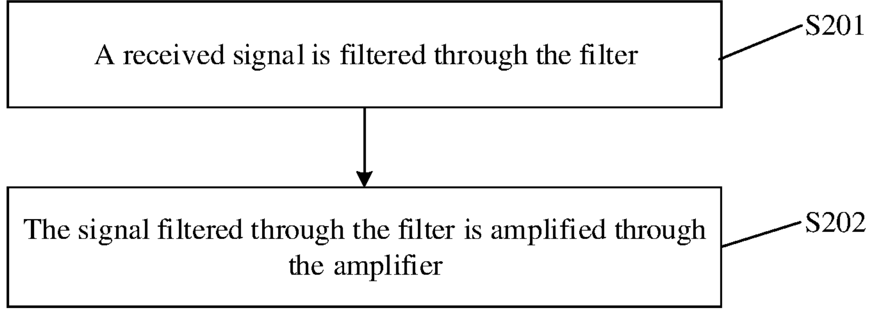
FIG. 2 shows an alternative flowchart of a signal receiving method provided by an embodiment of the disclosure.

In some embodiments, based on the signal receiving apparatus shown in FIG. 1, the method includes the following operations, as shown in FIG. 2.

In S201, a received signal is filtered through the filter.

Here, the filter includes at least one capacitor and at least one inductor. The at least one capacitor is disposed on the bare die. The at least one inductor is disposed on the lamina. The at least one inductor is connected to the bare die.

In S202, the signal filtered through the filter is amplified through the amplifier.

In some embodiments, some or all of the at least one inductor are implemented in the form of surface mounted devices (SMD). Alternatively, some or all of the at least one inductor are implemented in the form of metal winding.

Here, for the at least one inductor, it is possible that all of the at least one inductor are implemented in the form of SMDs.

Figure 3:
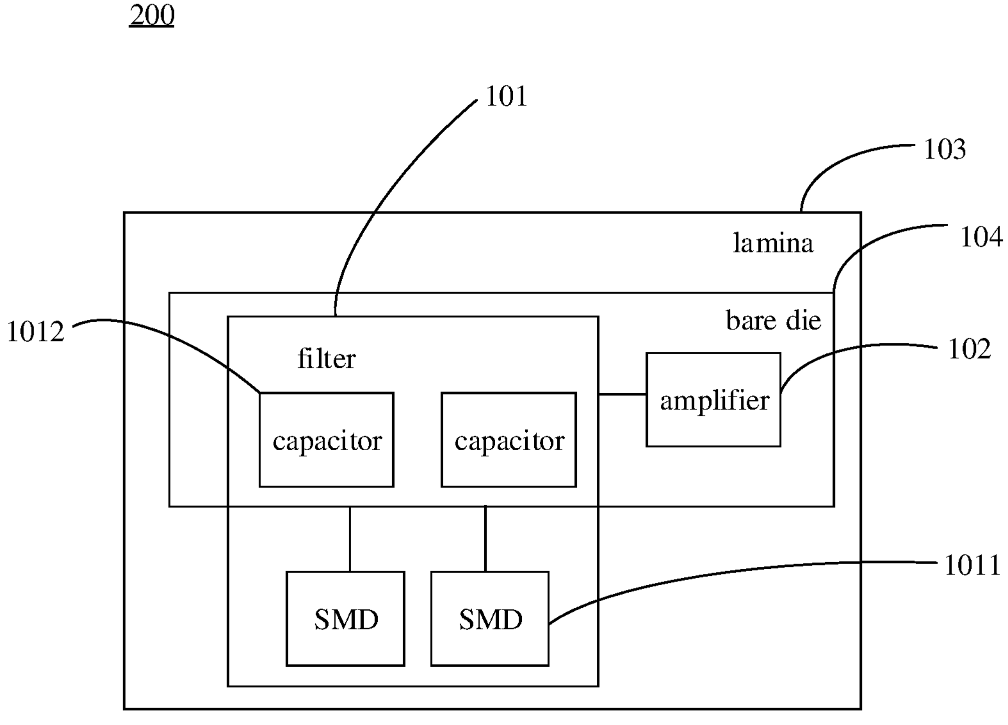
FIG. 3 shows an alternative structure diagram of a signal receiving apparatus provided by an embodiment of the disclosure.

In an example, as shown in FIG. 3, the filter 101 includes two inductors, and both of them are implemented in the form of SMDs.

For the at least one inductor, it is possible that all of the at least one inductor are implemented in the form of metal winding.

Figure 4:
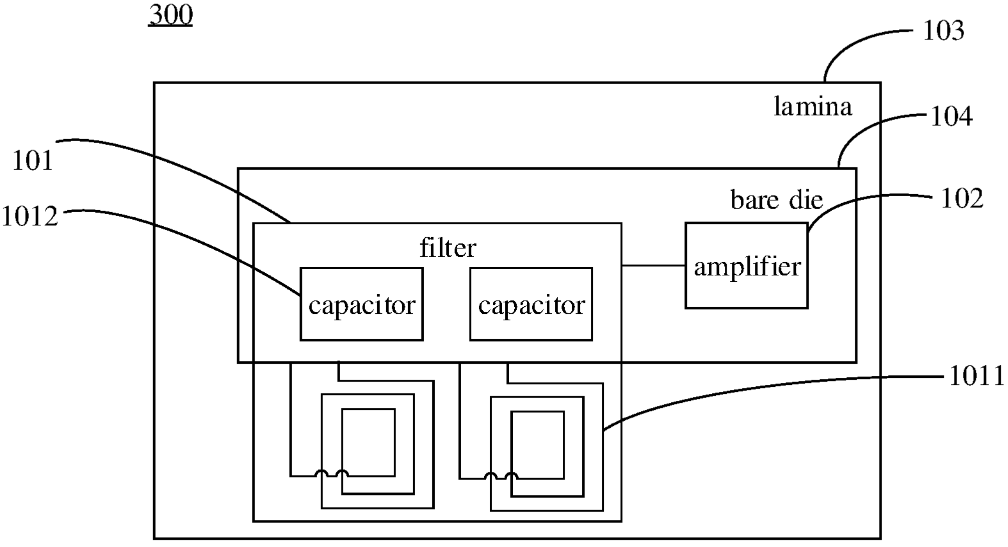
FIG. 4 shows an alternative structure diagram of a signal receiving apparatus provided by an embodiment of the disclosure.

In an example, as shown in FIG. 4, the filter 101 includes two inductors, and both of them are implemented in the form of metal winding.

For the at least one inductor, it is possible that some of the at least one inductor are implemented in the form of SMDs, and others of the at least one inductor are implemented in the form of metal winding.

In the embodiments of the disclosure, the bare die is mounted on the lamina, and thus there is a blank area around the bare die on the lamina. The blank area can prevent other devices from colliding with the bare die when the other devices are mounted. In the blank area, the inductor may be implemented in the form of metal winding. In this way, some of the inductors are implemented in the form of SMDs, and others of the inductors are implemented in the form of metal winding, such that device mounting may be reduced and it facilitates debugging.

Figure 5:
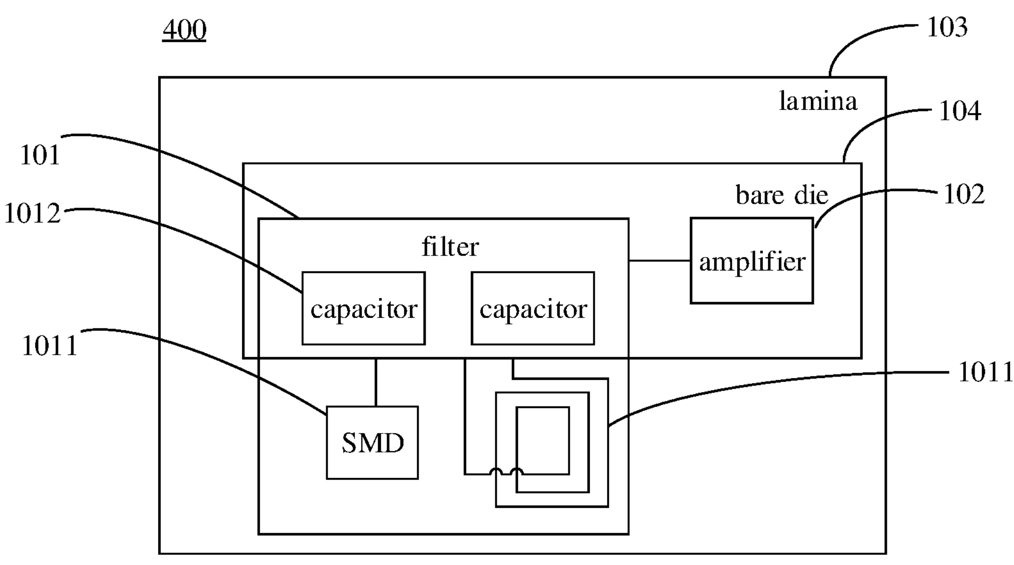
FIG. 5 shows an alternative structure diagram of a signal receiving apparatus provided by an embodiment of the disclosure.

In an example, as shown in FIG. 5, the filter 101 includes two inductors 1011. One of them is implemented in the form of a SMD, and the other one is implemented in the form of metal winding.

Here, for each of the at least one inductor, it may be implemented in the form of a SMD, or in the form of metal winding.

For the form of the SMD, the inductor may be packaged to form an inductor device, and then the packaged inductor device may be mounted on the lamina through the SMD. In this case, a specific material may be filled in the packaged inductor device, thereby improving a quality factor Q of the packaged inductor device.

In an example, as shown in FIG. 3, the packaged inductor device is mounted on the lamina 103 in the form of the SMD.

For the form of metal winding, the inductor may be implemented by metal winding on the lamina. In this case, since a metal on the lamina is thick, the quality factor Q of the inductor can be improved.

In an example, as shown in FIG. 4, an inductor 1011 is formed in the form of metal winding on the lamina 103.

In some embodiments, each of the at least one inductor includes a first interface. The first interfaces of all of the at least one inductor are connected to the bare die through wiring. Each of the at least one inductor further includes a second interface. The second interfaces of all of the at least one inductor are connected to the bare die through wiring.

Here, for each of the inductors, it includes the first interface and the second interface. For the at least one inductor, the first and second interfaces of all of the at least one inductor are connected to the bare die through wiring.

Figure 6:
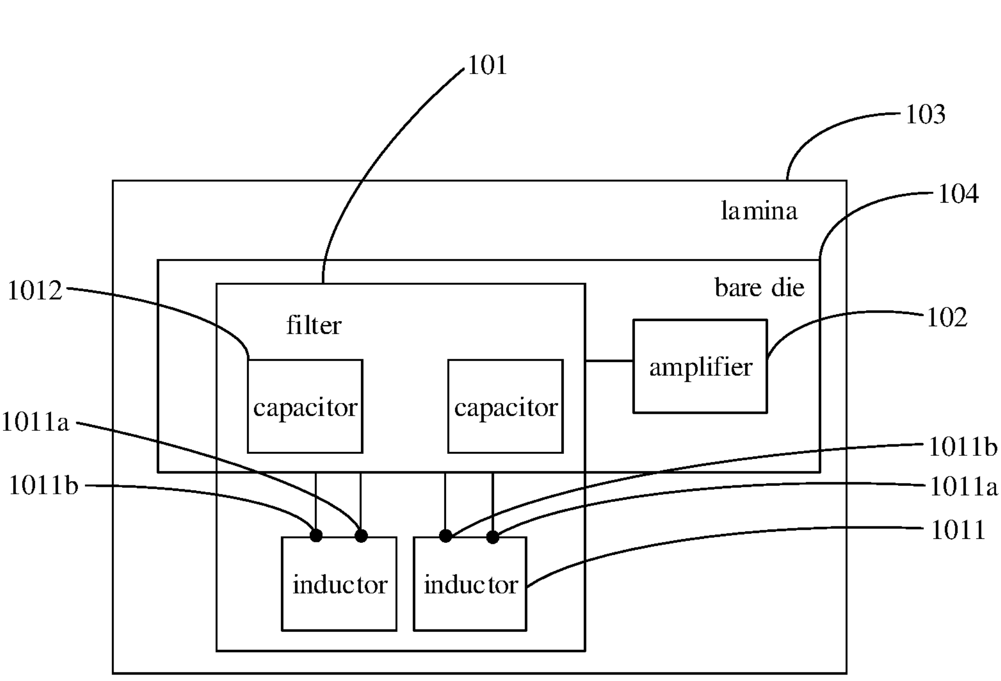
FIG. 6 shows an alternative structure diagram of a signal receiving apparatus provided by an embodiment of the disclosure.

In an example, as shown in FIG. 6, the filter 101 includes two inductors 1011. Each of the two inductors includes a first interface 1011*a* and a second interface 1011*b*. The first interfaces 1011*a* and the second interfaces 1011*b* of the two inductors are connected to the bare die 104 through wiring.

Here, in the case that the first interface is connected to the bare die through wiring, it is possible that one end of the wiring is connected to the first interface of the corresponding inductor, and the other end of the wiring is connected to the bare die, so that the first interface is connected to the bare die through the wiring.

In the case that the second interface is connected to the bare die through wiring, it is possible that one end of the wiring is connected to the second interface of the corresponding inductor, and the other end of the wiring is connected to the bare die, so that the second interface is connected to the bare die through the wiring.

In some embodiments, each of the at least one inductor includes a first interface. The first interfaces of all of the at least one inductor are connected to the bare die through wiring. Each of the at least one inductor further includes a second interface. The second interfaces of some of the at least one inductor are connected to the bare die through wiring. The second interfaces of others of the at least one inductor are connected to ground on the lamina.

Here, for each of the inductors, it includes a first interface and a second interface. For the at least one inductor, the first and second interfaces of some of the at least one inductor are connected to the bare die through wiring, and the first interfaces of others of the at least one inductor are connected to the bare die through wiring and the second interfaces thereof are connected to the bare die through wiring.

Figure 7:
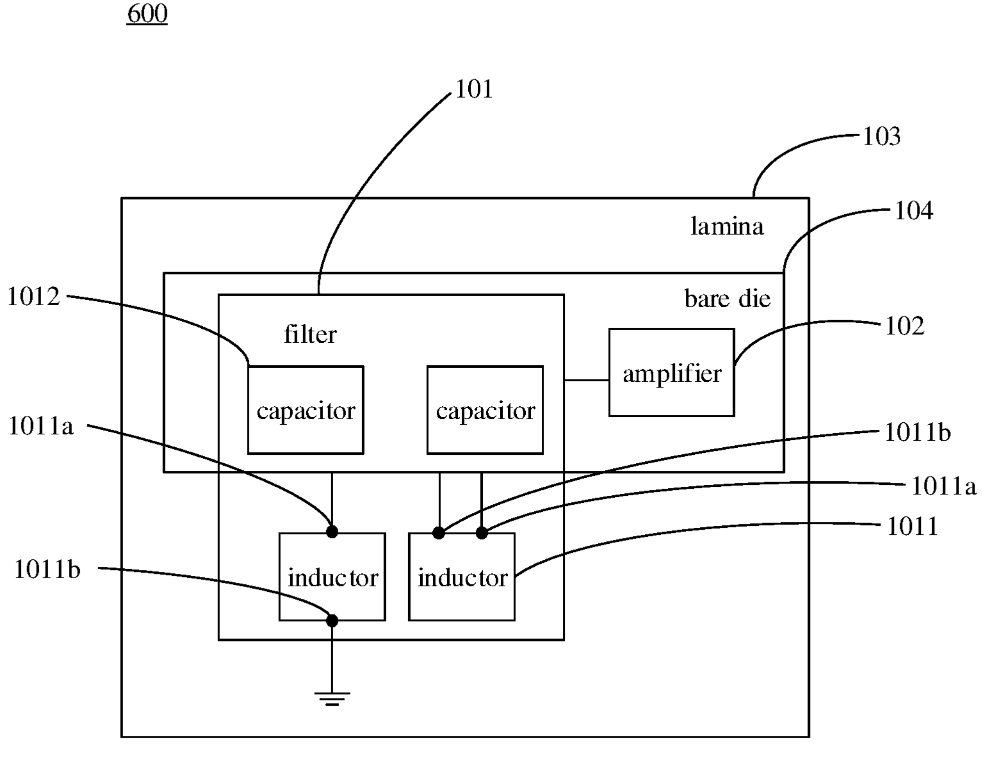
FIG. 7 shows an alternative structure diagram of a signal receiving apparatus provided by an embodiment of the disclosure.

In an example, as shown in FIG. 7, the filter 101 includes two inductors 1011. For the two inductors, the first interface 1011*a* and the second interface 1011*b* of one of them are connected to the bare die through wiring, and the first interface 1011*a* of the other one is connected to the bare die through wiring, and the second interface 1011*b* of the other one is connected to ground on the lamina through wiring.

In some embodiments, each of the at least one inductor includes a first interface. The first interfaces of all of the at least one inductor are connected to the bare die through wiring. Each of the at least one inductor further includes a second interface. The second interfaces of all of the at least one inductor are connected to ground on the lamina.

Here, for each of the inductors, it includes a first interface and a second interface. For the at least one inductor, the first interfaces of all of the at least one inductor are connected to the bare die through wiring, and the second interfaces of all of the at least one inductor are connected to ground on the lamina.

Figure 8A:
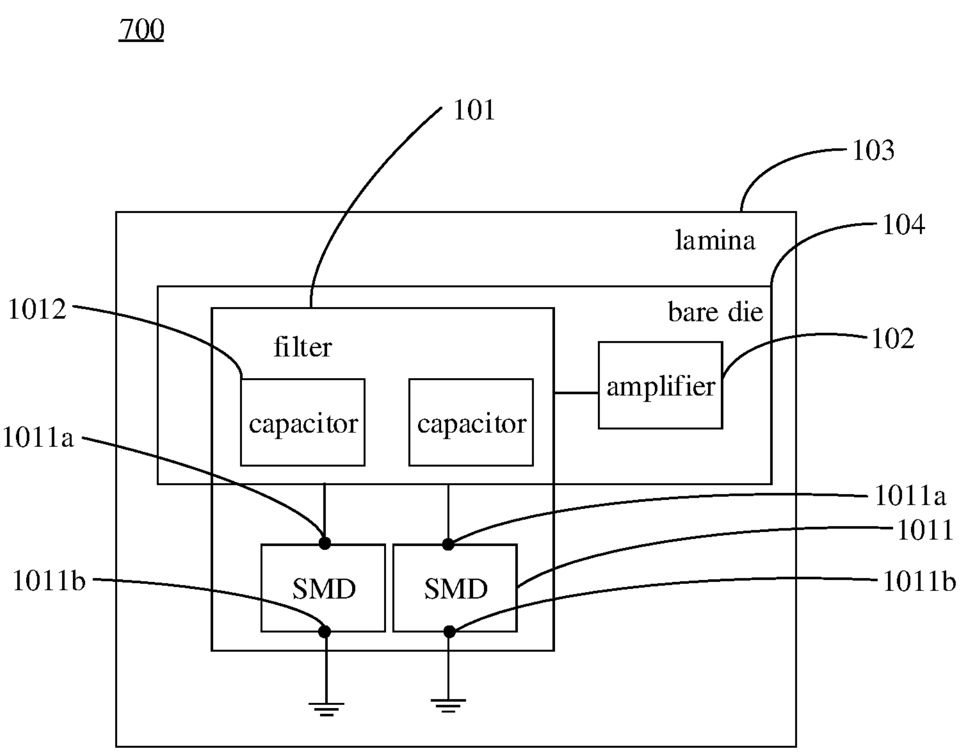
FIG. 8A shows an alternative structure diagram of a signal receiving apparatus provided by an embodiment of the disclosure.

In an example, as shown in FIG. 8A, the filter includes two inductors 1011 implemented in the form of SMDs. The first interfaces 1011*a* of the two inductors are connected to the bare die through wiring, and the second interfaces 1011*b* of the two inductors are connected to ground on the lamina.

Figure 8B:
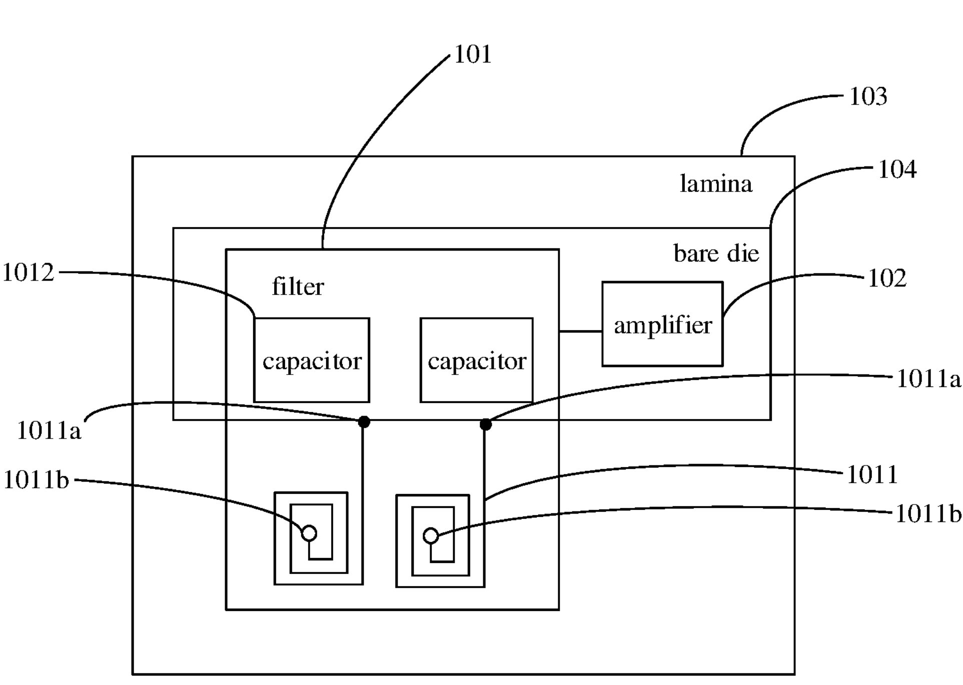
FIG. 8B shows an alternative structure diagram of a signal receiving apparatus provided by an embodiment of the disclosure.

In another example, as shown in FIG. 8B, the filter includes two inductors 1011 implemented in the form of metal winding. The first interfaces 1011*a* of the two inductors are connected to the bare die through wiring, and the second interfaces 1011*b* of the two inductors are connected to ground on the lamina.

Figure 9:
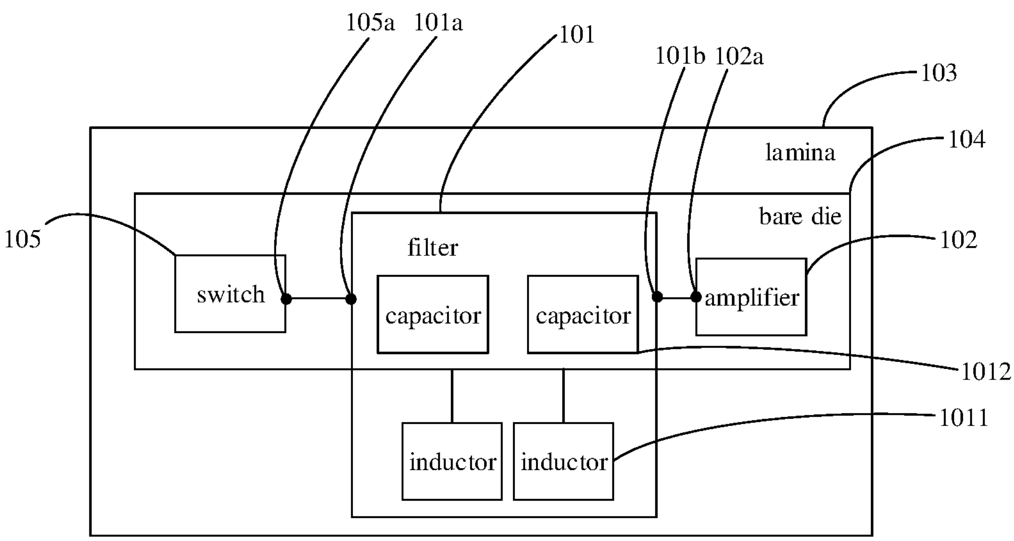
FIG. 9 shows an alternative structure diagram of a signal receiving apparatus provided by an embodiment of the disclosure.

In some embodiments, as shown in FIG. 9, the apparatus further includes a switch 105 disposed on the bare die. The switch 105 is configured to control a signal input to the filter 101. An output interface 105*a* of the switch 105 is connected to an input interface 101*a* of the filter 101. An output interface 101*b* of the filter 101 is connected to an input interface 102*a* of the amplifier 102.

As shown in FIG. 9, the output interface 105*a* of the switch 105 is connected to the input interface 101*a* of the filter 101, and thus the switch 105 is configured to control the signal input to the filter 101. Since the output interface 101*b* of the filter 101 is connected to the input interface 102*a* of the amplifier 102, a signal filtered through the filter 101 can be transmitted to the amplifier 102 through the input interface 102*a*, and the amplifier 102 amplifies the filtered signal after receiving the filtered signal.

Here, the switch may be a single-pole multi-throw switch or a multi-pole multi-throw switch. The switch may be configured not only to control the signal input to the filter, but also to switch other paths, for example, other receiving links or transmitting links.

In the embodiments of the disclosure, the output interface of the switch is connected to the input interface of the filter, and the output interface of the filter is connected to the input interface of the amplifier. In this way, the connection relationship among the switch, the filter and the amplifier may be the switch, the filter and the amplifier, allowing to first control a signal input to the filter by the switch, and then filter the input signal through the filter, followed by amplifying the filtered signal through the amplifier.

In some embodiments, as shown in FIG. 9, the output interface 105*a* of the switch 105 and the input interface 101*a* of the filter 101 are connected on the bare die 104. The output interface 101*b* of the filter 101 and the input interface 102*a* of the amplifier 102 are connected on the bare die 104. In this way, integration of the signal receiving apparatus can be improved, space occupation of the signal receiving apparatus can be reduced, and better performance can be obtained.

Figure 10:
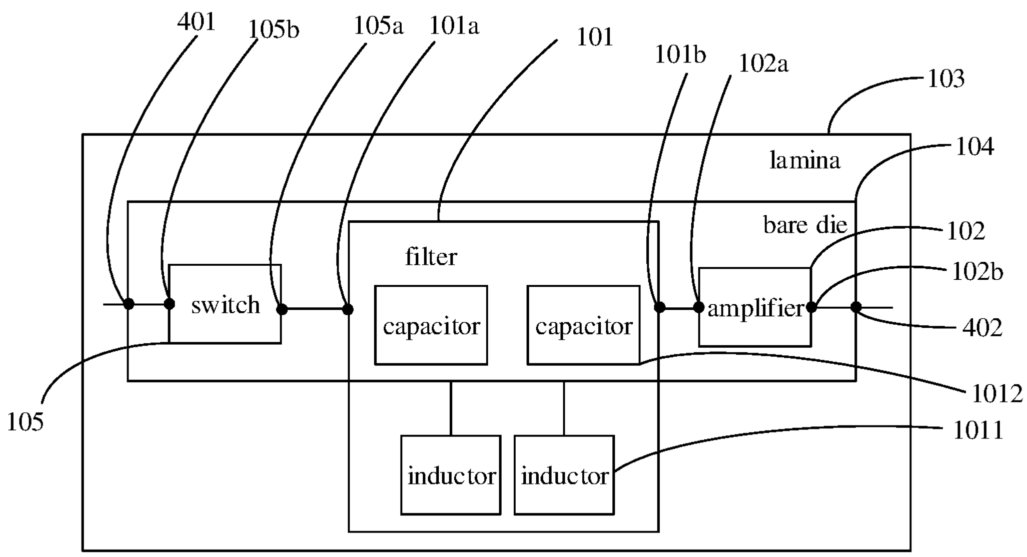
FIG. 10 shows an alternative structure diagram of a signal receiving apparatus provided by an embodiment of the disclosure.

In some embodiments, as shown in FIG. 10, an input interface 105*b* of the switch 105 is connected to the lamina 103 through a first connection point 401 on the bare die 104. An output interface 102*b* of the amplifier 102 is connected to the lamina 103 through a second connection point 402 on the bare die 104.

Here, the first connection point and the second connection point may be disposed at any position on the bare die 104, which is not limited in the embodiments of the disclosure.

The first connection point and the second connection point each are interconnected with the bare die by being disposed on the bare die. The way of interconnection is not limited in the embodiments of the disclosure.

The first connection point and the second connection point each may be interconnected with the bare die by a metal part. The metal part may be made of copper or silver, which is not limited in the embodiments of the disclosure. The metal parts may be disposed vertically or in other manners, which is not limited in the embodiments of the disclosure.

In an example, the first connection point and the second connection point each are interconnected with the bare die through vertical copper pillars.

In another example, the first connection point and the second connection point each are interconnected with the bare die through bonding wires.

In yet another example, the first connection point is interconnected with the bare die through a vertical copper pillar, and the second connection point is interconnected with the bare die through a bonding wire.

In some embodiments, the filter module is implemented in the form of a LC filter structure. The RF switch module, the LNA module and the capacitors in the LC filter module are implemented on the same bare die, and the inductors in the LC filter module are implemented on the lamina in the RF front-end module. Specifically, the inductors may be implemented in the form of compact SMDs or by metal winding taking advantage of the lamina, to implement the RF inductors. The input and output interfaces between the modules are connected on the same bare die, so that the integration can be improved for the receiving link, and space occupation in the RF front-end module can be reduced and better performance can be obtained.

In the signal receiving apparatus provided by the disclosure, interconnection between the inputs and outputs of the RF switch module, the low noise amplifier module and the LC filter module is implemented on the same bare die, which reduces the number of the interconnection nodes, which are disposed out of the bare die, of the inputs and the outputs. The input and output terminals of the whole receiving link and the bare die are interconnected on the lamina respectively. In addition, the inductors in the LC filter module are interconnected with the lamina through the bare die. The wiring interconnected with the inductor may be considered as part of the inductor at the RF front-end, which is beneficial to reduce the influence of the interface interconnection wiring on the performance. The inductors of the LC filter module may comprise multiple inductors, one end of which is connected to the bare die and the other end of which is connected to ground, and multiple inductors, both ends of which are connected to the bare die. The inductor may be implemented in the form of a compact SMD or by metal winding taking advantage of the lamina.

In the disclosure, the inductors of the LC filter of the receiving link in the RF front-end module are implemented by compact SMDs. Based on a silicon process of high-performance insulating substrate, the RF switch module, the low noise amplifier module and the capacitors in the LC filter module are implemented on the same bare die. The input and output interfaces between the modules are interconnected on the bare die. The inductors in the LC filter are mounted on the lamina around the bare die through the compact SMDs with a high Q value. For the inductor device mounted on the lamina, one end of the inductor device may be connected to the bare die and the other end of the inductor device may be connected to ground on the lamina, or both ends of the inductor device may be connected to the bare die respectively. In this way, the space on the lamina is fully utilized and it facilitates the debugging of the module.

Furthermore, in the disclosure, the inductors of the LC filter of the receiving link in the RF front-end module may be implemented by metal winding on the lamina. Based on a silicon process of high-performance insulating substrate, the RF switch module, the low noise amplifier module and the capacitors in the LC filter module are implemented on the same bare die. The interfaces between the modules are interconnected on the bare die. The inductors in the LC filter are implemented by metal winding on the lamina around the bare die. In this way, a high Q value of the inductor may be implemented. For the inductors implemented by metal winding on the lamina, one end of the inductor may be connected to the bare die and the other end of the inductor may be connected to ground on the lamina, or both ends of the inductor may be connected to the bare die respectively. In this way, the packaging space on the lamina is fully utilized, the device mounting is reduced, and the cost is reduced.

Moreover, the above methods may be combined to implement the inductors of the LC filter of the receiving link in the same RF front-end module. Some of the inductors in the same RF front-end module are mounted on the lamina around the bare die in the form of compact SMDs with a high Q value, and others of the inductors in the same RF front-end module are implemented by metal winding on the lamina around the bare die. Both types of the inductors coexist, so that device mounting is reduced and it facilitates debugging.

The signal receiving apparatus provided by the disclosure has the advantages of simple implementation, high integration, small space occupation in the RF front-end module and low cost. The inductors in the LC filter are implemented, out of the bare die, in the form of SMDs with a high Q value or metal winding on the lamina, so that the insertion loss of the filter is small and the performance of the whole receiving link is better.

The embodiments of the disclosure provide a storage medium, that is, a computer-readable storage medium, on which a computer program is stored. When the computer program is executed by a processor, the signal receiving method provided by the above embodiments is performed.

It should be noted that the description of the embodiments of the above storage medium and apparatus is similar to the description of the above method embodiments, and the embodiments of the above storage medium and apparatus have similar beneficial effects to the method embodiments. For technical details not disclosed in the embodiments of the storage medium and apparatus of the disclosure, reference may be made to the description of the method embodiments of the disclosure for understanding.

It is to be understood that “an embodiment” or “one embodiment” referred to throughout the specification means that particular features, structures or characteristics associated with the embodiment are included in at least one embodiment of the disclosure. Therefore, the words “in an embodiment” or “in some embodiments” appearing throughout the specification do not necessarily refer to the same embodiment(s). In addition, these particular features, structures or characteristics may be combined in one or more embodiments in any suitable manners. It is to be understood that in the various embodiments of the disclosure, the serial numbers of the above-mentioned operations do not represent the sequence of performing the operations. The sequence of performing the operations should be determined by their functions and inherent logic. Therefore, the serial numbers should not be considered as any limitations to the implementation process of the embodiments of the disclosure. The serial numbers of the above embodiments in this disclosure are only used for description, and do not represent the preferability of the embodiments.

It is to be noted that, in the disclosure, the term “include”, “comprise” or any other variants thereof is intended to encompass non-exclusive inclusion, so that a process, method, article or apparatus that includes a set of elements includes not only those elements, but also other elements that are not explicitly listed, or further the elements inherent to such a process, method, article or apparatus. In the absence of further limitations, an element defined by the phrase “including a . . . ” does not exclude existence of another identical element in the process, method, article or apparatus including the element.

In the several embodiments provided by the disclosure, it should be understood that the disclosed apparatus and method may be implemented in other manners. The embodiments of the apparatus described above are only illustrative. For example, the division of the units is only a logical function division, and there may be other division methods in practical implementation, for example, multiple units or components can be combined, or be integrated into another system, or some features can be ignored or not executed. In addition, coupling, or direct coupling, or communication connection between the various components shown or discussed herein may be implemented by some interfaces. Indirect coupling or communication connection between the apparatuses or units may be electrical, mechanical, or of other forms.

The units described above as separate elements may or may not be physically separated. The elements shown as units may or may not be physical units. They may be located in one place or may be distributed over multiple network elements. According to the actual needs, some or all of the units can be selected to achieve the objective of the solutions of the embodiments.

In addition, all of the functional units in each embodiment of the disclosure may be integrated into one processing unit, or each of the functional units may be separately used as one unit, or two or more of the functional units may be integrated into one unit. The integrated unit may be implemented either in the form of hardware or in the form of hardware plus software functional unit.

Those of ordinary skill in the art will appreciate that all or part of the operations for implementing the embodiments of the method may be accomplished by means of hardware associated with program instructions. The program may be stored in a computer readable storage medium, and when the program is executed, the operations included in the embodiments of the method are performed. The aforementioned storage medium includes various media capable of storing program codes, such as a portable storage device, a read only memory (ROM), a magnetic disk or an optical disk.

Alternatively, if the above integrated unit of the disclosure is implemented in a form of a software functional module and is sold or used as an independent product, it may also be stored in a computer-readable storage medium. Based on such understanding, the technical solution of the embodiments of the disclosure in essence or the part of the technical solution that contributes to some implementations can be embodied in the form of a software product. The computer software product is stored in a storage medium and includes instructions which allow a computer device (which may be a personal computer, a server, a network device, etc.) to perform all or part of the methods described by various embodiments of the disclosure. The aforementioned storage medium includes various media capable of storing program codes, such as a portable storage device, a ROM, a magnetic disk or an optical disk.

The above is only the embodiments of the disclosure, but the scope of protection of the disclosure is not limited thereto. Any artisans familiar with the technical field can easily think of modifications or replacements within the technical scope disclosed in the disclosure, which should be covered within the scope of protection of the disclosure. Therefore, the scope of protection of this disclosure shall be construed only by the claims.

The disclosure provides a signal receiving apparatus. By disposing at least one inductor on the lamina, the quality factor of the inductor in the filter can be improved, thereby improving the overall performance of the signal receiving apparatus, Moreover, the signal receiving apparatus has the advantages of simple implementation, high integration, small space occupation in the RF front-end module, low cost and convenient debugging. The inductors in the filter are implemented, out of the bare die, in the form of SMDs with a high Q value or by metal winding on the lamina, so that the insertion loss of the filter is small and the performance of the overall receiving link is better.

The invention claimed is:

1. A signal receiving apparatus, comprising: a filter, a lamina, and a bare die disposed on the lamina, wherein at least one radio frequency device is disposed on the bare die, and the at least one radio frequency device and the filter are connected on the bare die;

the filter is configured to filter a received signal, and the filter comprises at least one capacitor and at least one inductor;

the at least one capacitor is disposed on the bare die; and the at least one inductor is disposed on the lamina, and the at least one inductor is connected to the bare die.

2. The apparatus of claim 1, wherein some or all of the at least one inductor are implemented in a form of surface mounted devices (SMD); or some or all of the at least one inductor are implemented in a form of metal winding.

3. The apparatus of claim 1, wherein each of the at least one inductor comprises a first interface; and the first interfaces of all of the at least one inductor are connected to the bare die through wiring.

4. The apparatus of claim 3, wherein each of the at least one inductor further comprises a second interface; and the second interfaces of some or all of the at least one inductor are connected to the bare die through wiring; or the second interfaces of some or all of the at least one inductor are connected to ground on the lamina.

5. The apparatus of claim 1, wherein the apparatus further comprises a switch disposed on the bare die; the switch is configured to control a signal input to the filter; and an output interface of the switch is connected to an input interface of the filter.

6. The apparatus of claim 1, wherein the apparatus further comprises an amplifier disposed on the bare die; the amplifier is configured to amplify a signal filtered through the filter; and an input interface of the amplifier is connected to an output interface of the filter.

7. The apparatus of claim 5, wherein the apparatus further comprises an amplifier disposed on the bare die;

the output interface of the switch and the input interface of the filter are connected on the bare die; and an output interface of the filter and an input interface of the amplifier are connected on the bare die.

8. The apparatus of claim 7, wherein an input interface of the switch is connected to the lamina through a first connection point on the bare die; and an output interface of the amplifier is connected to the lamina through a second connection point on the bare die.

9. A signal receiving method, applied to a signal receiving apparatus comprising a filter, the method comprising:

filtering a received signal through the filter to obtain a filtered signal, wherein the filter comprises at least one capacitor and at least one inductor; the at least one capacitor is disposed on a bare die; the at least one inductor is disposed on a lamina; the at least one inductor is connected to the bare die; at least one radio frequency device is disposed on the bare die; and the at least one radio frequency device and the filter are connected on the bare die.

10. A non-transitory computer storage medium, storing a computer program, wherein the signal receiving method of claim 9 is performed, when the computer program is executed by a processor.

* * * * *